US008708712B2

(12) United States Patent
Iida

(10) Patent No.: US 8,708,712 B2
(45) Date of Patent: Apr. 29, 2014

(54) MALE CONNECTOR BLOCK, FEMALE CONNECTOR BLOCK, AND CONNECTOR

(75) Inventor: Mituru Iida, Mie (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 13/518,104

(22) PCT Filed: Dec. 21, 2010

(86) PCT No.: PCT/IB2010/003319
§ 371 (c)(1),
(2), (4) Date: Jun. 21, 2012

(87) PCT Pub. No.: WO2011/077228
PCT Pub. Date: Jun. 30, 2011

(65) Prior Publication Data
US 2012/0270423 A1  Oct. 25, 2012

(30) Foreign Application Priority Data

Dec. 25, 2009  (JP) .................................. 2009-295422

(51) Int. Cl.
*H01R 12/00* (2006.01)
(52) U.S. Cl.
USPC ............................................................ 439/67
(58) Field of Classification Search
USPC ............................................. 439/67, 65, 82
See application file for complete search history.

(56) References Cited

U.S. PATENT DOCUMENTS

| 3,611,269 A * | 10/1971 | Reed ............................... 439/526 |
| 3,701,964 A * | 10/1972 | Cronin ............................. 439/45 |
| 4,526,432 A * | 7/1985 | Cronin et al. .................. 439/320 |
| 4,736,266 A * | 4/1988 | Tanibe ........................... 361/816 |
| 4,871,317 A * | 10/1989 | Jones ............................... 439/68 |
| 5,030,110 A * | 7/1991 | Groves et al. .................... 439/69 |
| 7,156,689 B2 * | 1/2007 | Fabian et al. .................. 439/417 |
| 7,722,362 B2 * | 5/2010 | Frake et al. ................... 439/76.1 |
| 8,267,700 B2 * | 9/2012 | Mizoguchi ....................... 439/67 |
| 2009/0208168 A1 * | 8/2009 | Ishikawa et al. ................ 385/14 |
| 2011/0039427 A1 * | 2/2011 | Mizoguchi ....................... 439/77 |
| 2011/0269321 A1 * | 11/2011 | Mizoguchi ....................... 439/77 |
| 2012/0149232 A1 * | 6/2012 | Balzano ......................... 439/370 |

FOREIGN PATENT DOCUMENTS

| JP | 11149952 | 6/1999 |
| JP | 2007134169 | 5/2007 |
| JP | 4059522 | 12/2007 |
| WO | 2008133259 | 11/2008 |
| WO | 2009139323 | 11/2009 |

OTHER PUBLICATIONS

The International Search Report for PCT/IB2010/003319.

* cited by examiner

*Primary Examiner* — Tulsidas C Patel
*Assistant Examiner* — Phuongchi T Nguyen
(74) *Attorney, Agent, or Firm* — Bacon & Thomas, PLLC

(57) ABSTRACT

The connector includes a male connector block and a female connector block. The male connector block includes a base substrate formed of an insulating flat member; a conductive projection arranged on one surface of the base substrate; a first circuit pattern led out from the conductive projection; and a soldering terminal section electrically connected to the conductive projection through the first circuit pattern. The female connector block includes: an insulating film having a fitting insertion section; a conductive section formed on one surface of the insulating film and electrically connected to the conductive projection inserted into the fitting insertion section; a second circuit pattern led out from the conductive section; a soldering terminal section electrically connected to the conductive section through the second circuit pattern; and a second base substrate making close contact with the other surface of the insulating film.

5 Claims, 9 Drawing Sheets

MALE CONNECTOR BLOCK, FEMALE CONNECTOR BLOCK, AND CONNECTOR

FIELD OF THE INVENTION

The present invention relates to a male connector block, a female connector block and a connector.

BACKGROUND OF THE INVENTION

Conventionally, as one method of mechanically and electrically interconnecting first and second circuit boards 8 and 9 whose surfaces are at least partially opposed to each other as shown in FIG. 7, there is known a method using a connector structure by which a first connector block 81 one-piece formed with the first circuit board 8 is connected to a second connector block 91 one-piece formed with the second circuit board 9 (see, e.g., JP Patent No. 4059522).

The first connector block 81 includes conductor protrusions 81a making electrical conduction with circuit patterns 8a of the first circuit board 8 and protruding from one surface of the first circuit board 8.

The second connector block 91 includes slit portions 9b formed in the second circuit board 9 to have a substantially cross-like shape, conductor portions 9c (see FIG. 8) formed on one surface of the second circuit board 9 along the peripheral edges of the slit portions 9b to make electrical conduction with circuit patterns 9a of the second circuit board 9, and a reinforcing plate 9e made of a substantially flat metal plate and bonded to the other surface of the second circuit board 9. The reinforcing plate 9e has insertion holes 9d formed in alignment with the slit portions 9b.

If the conductor protrusions 81a of the first connector block 81 are inserted into the slit portions 9b at one side of the second connector block 91, the conductor protrusions 81a and the slit portions 9b are fitted and connected to each other. The conductor protrusions 81a and the conductor portions 9c make electrical conduction with each other. Thus the first circuit board 8 and the second circuit board 9 are electrically and mechanically connected to each other.

In the connector structure using the first and second connector blocks 81 and 91 one-piece formed with the first and second circuit boards 8 and 9, it is however impossible to replace only the first connector blocks 81 and/or the second connector block 91 when a trouble is generated in the first connector block 81 and/or the second connector block 91. This poses a problem in that the first circuit board 8 or the second circuit board 9 needs to be replaced as a whole.

Due to the formation of the slit portions 9b, the strength of the second circuit board 9 is reduced in the vicinity of the slit portions 9b. This imposes a restriction in that electronic parts such as an IC and the like cannot be mounted to the second circuit board 9 near the second connector block 91 having the slit portions 9b. This leads to a problem in that the degree of freedom of circuit design gets lowered.

SUMMARY OF THE INVENTION

In view of the above, the present invention provides a connector capable of solving a trouble generated in a mechanical part for electrical and mechanical connection of circuit boards without having to replace the circuit boards and capable of enhancing the degree of freedom of circuit design.

In accordance with a first aspect of the present invention, there is provided a male connector block for electrically and mechanically connecting a circuit board to a female substrate in which a conductive section electrically connected to a second circuit pattern extends along a fitting insertion section formed in a circuit board, including: a first base substrate formed of an insulating flat member; a conductive projection arranged on one surface of the first base substrate, the conductive projection inserted into the fitting insertion section of the female substrate and electrically connected to the conductive section; a first circuit pattern led out from the conductive projection; and a soldering terminal section formed on the first base substrate and electrically connected to the conductive projection through the first circuit pattern, the male connector block mounted to the first circuit board.

With such configuration, there is no need to replace the first circuit board when a trouble is generated. The trouble can be solved by merely detaching the male connector block from the first circuit board and replacing the male connector block with a new one.

In accordance with a second aspect of the present invention, there is provided a female connector block for electrically and mechanically connecting a circuit board to a male connector block in which a conductive projection electrically connected to a first circuit pattern of a first base substrate protrudes from a surface of the first base substrate, including: an insulating film having a fitting insertion section into which the conductive projection of the male connector block is inserted; a conductive section formed on one surface of the insulating film and electrically connected to the conductive projection inserted into the fitting insertion section; a second circuit pattern led out from the conductive section and formed on one surface of the insulating film; a soldering terminal section formed on one surface of the insulating film and electrically connected to the conductive section through the second circuit pattern; and a second base substrate making close contact with the other surface of the insulating film, the insulating film wrapped onto the second base substrate, the second base substrate having an insertion hole formed in alignment with the fitting insertion section, the female connector block mounted to the circuit board.

With such configuration, there is no need to replace the second circuit board when a trouble is generated. The trouble can be solved by merely detaching the female connector block from the second circuit board and replacing the female connector block with a new one.

The second base substrate may include a substrate body onto which the insulating film is wrapped and a reinforcing portion extending from the substrate body, the reinforcing portion opposed to at least one of mutually-opposing lateral edges of the substrate body across with a gap therebetween, the reinforcing portion soldered to the circuit board, the insulating film wrapped onto the substrate body through the gap.

With such configuration, the reinforcing portion can increase the strength of the substrate body onto which the insulating film is wrapped. It is therefore possible to restrain the female connector block from being deformed when the male connector block and the female connector block are detached from each other. This makes it possible to prevent the second soldering terminal section from being broken by the deformation of the female connector block.

In accordance with a third aspect of the present invention, there is provided a connector for electrically and mechanically interconnecting two circuit boards whose surfaces are at least partially opposed to each other, includes the male connector block described above; and the female connector block described above, the conductive projection of the male connector block inserted into the fitting insertion section of the female connector block and electrically connected to the conductive section.

With such configuration, the male connector block and the female connector block for electrically and mechanically connecting the first and second circuit boards are formed independently of the first and second circuit boards. Accordingly, even if a trouble is generated in the male connector block or the female connector block, it is not necessary to replace the first circuit board or the second circuit board. The trouble can be solved by merely replacing the male connector block or the female connector block.

Since no slit is formed in the first circuit board or the second circuit board, it is possible to enhance the degree of freedom of circuit design.

As stated above, the present invention can provide a connector capable of solving a trouble generated in a mechanical part for electrical and mechanical connection of circuit boards without having to replace the circuit boards and capable of enhancing the degree of freedom of circuit design.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

Figure 1:
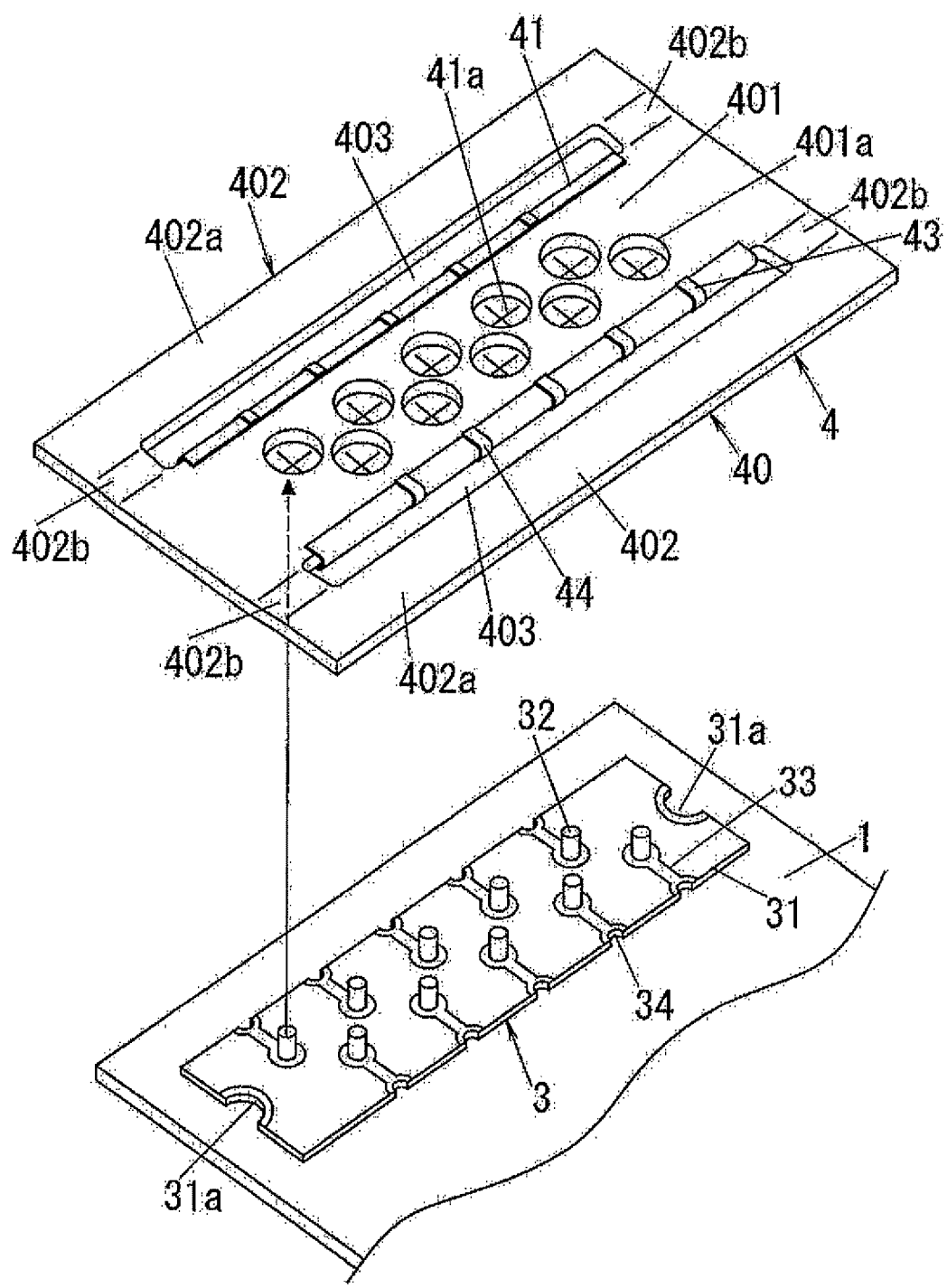
FIG. 1 is a perspective view showing a connector according to one embodiment of the present invention.
Figure 2:
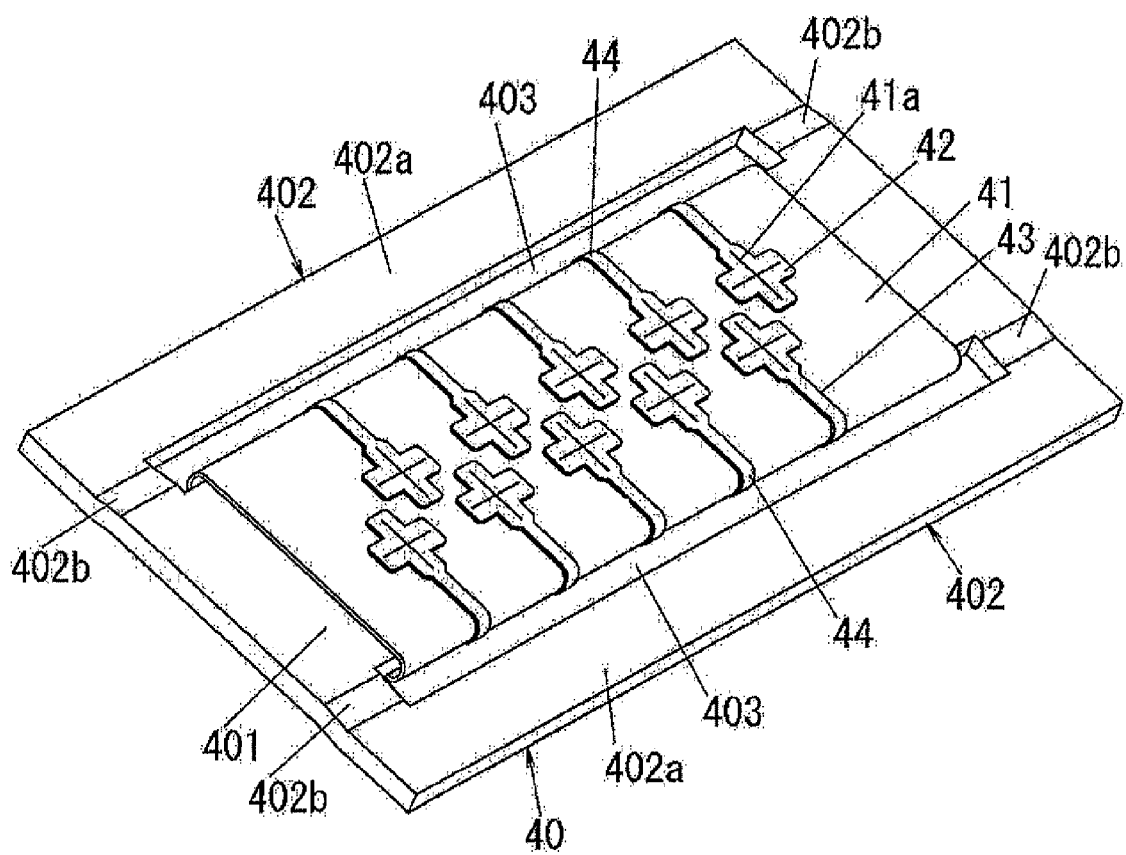
FIG. 2 is a perspective view showing a female connector block of the connector.

Hereinafter, an embodiment of the present invention will now be described in detail with reference to the accompanying drawings which form a part hereof. Identical or similar components throughout the drawings will be designated by like reference symbols with no repeated description made thereon.

(Embodiment)

A connector according to one embodiment of the present invention will be described with respect to FIGS. 1 through 6.

The connector of the present embodiment is a connector for mechanically and electrically connecting a rigid substrate (first circuit board) 1 and a flexible substrate (second circuit board) 2, the surfaces of which are partially arranged to face each other. The connector includes a first connector block (male connector block) 3 mounted to the rigid substrate 1 and a second connector block (female connector block) 4 mounted to the flexible substrate 2.

The male connector block 3 includes a first base substrate 31 having a substantially flat shape, conductive projections 32 protruding from one surface of the first base substrate 31, first circuit patterns 33 formed on one surface of the first base substrate 31 to extend from the conductive projections 32, and first soldering terminal sections 34 making electrical conduction with the conductive projections 32 through the first circuit patterns 33.

The first base substrate 31 is formed into a substantially rectangular plate shape by an insulating material such as glass epoxy or the like. Soldering sections 31a cut into a substantially semicircular shape and plated with, e.g., copper, are formed at the longitudinal opposite ends of the first base substrate 31.

The conductive projections 32 are formed into a substantially rod-like shape by a metallic material, e.g., copper, and are alternately arranged at one long edge side of the first base substrate 31 and at the other long edge side of the first base substrate 31 along the longitudinal direction of the first base substrate 31. The material of the conductive projections 32 is not limited to the metallic material such as copper and the like but may be a molded product, e.g., a resin-molded product, whose surface is plated with metal.

The arrangement positions of the conductive projections 32 are not limited to the ones set forth above. Alternatively, plural pairs of conductive projections 32 arranged side by side in the transverse direction of the first base substrate 31 may be provided along the longitudinal direction of the first base substrate 31.

Figure 3A:
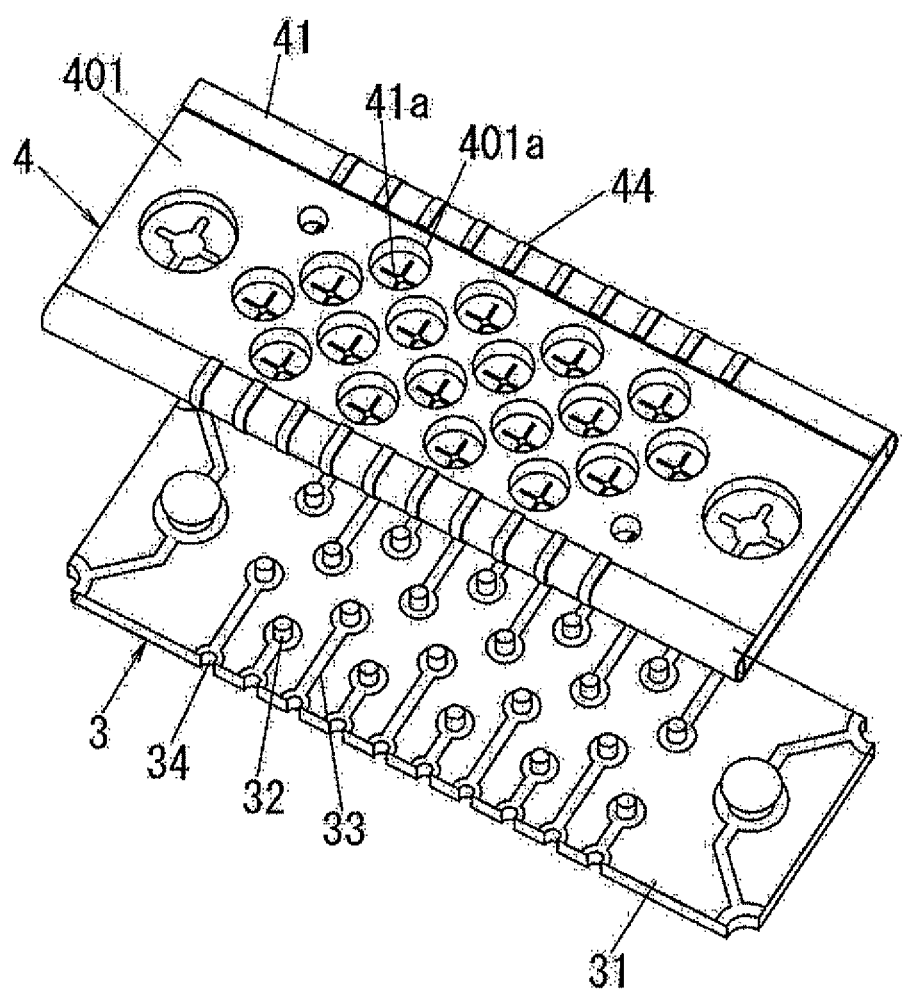
FIGS. 3A and 3B are perspective views showing one modified example of the connector.
Figure 3B:
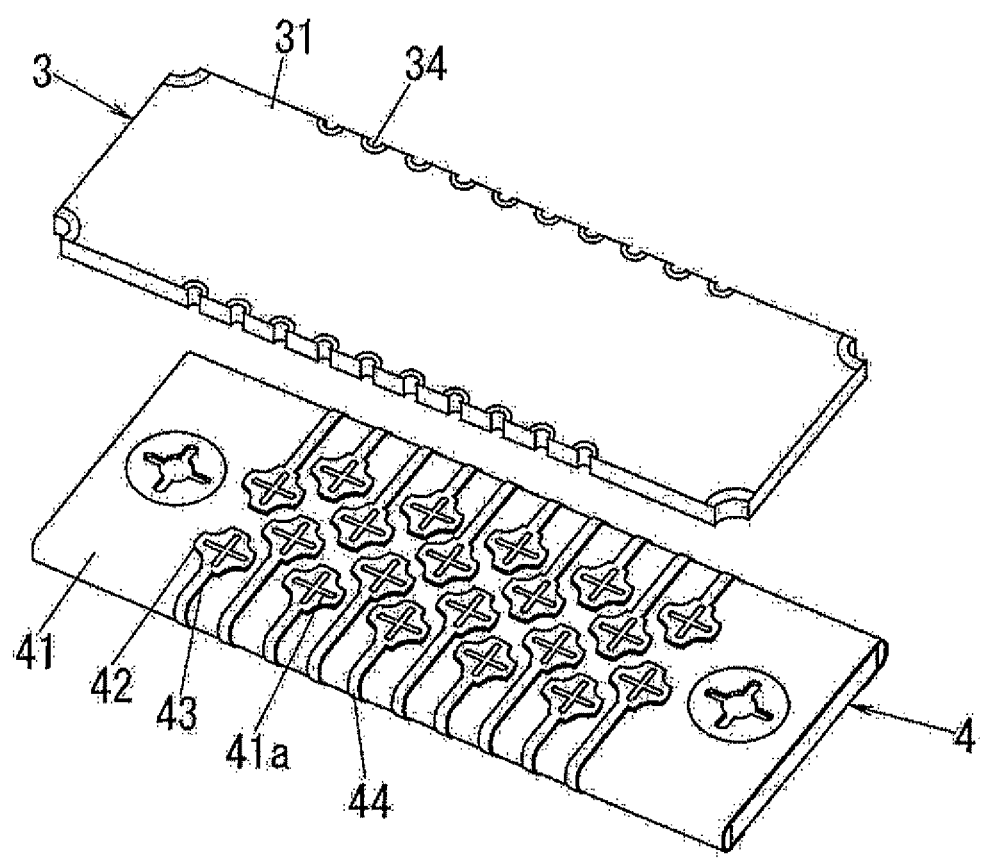

In the further alternative, as shown in FIGS. 3A and 3B, plural sets of conductive projections 32 arranged along the longitudinal direction of the first base substrate 31 may be provided in plural rows (four rows in FIGS. 3A and 3B).

The first circuit patterns 33 are led out from the conductive projections 32 and are formed to extend from the conductive projections 32 to the long edges of the first base substrate 31. In this regard, the first circuit patterns 33 led out from the conductive projections 32 existing at one long edge side of the first base substrate 31 are formed to extend toward one long edge of the first base substrate 31. The first circuit patterns 33 led out from the conductive projections 32 existing at the other long edge side of the first base substrate 31 are formed to extend toward the other long edge of the first base substrate 31.

The first soldering terminal sections 34 are formed by cutting different portions of the first base substrate 31 into a substantially semicircular shape and plating the cutout portions with, e.g., copper. The first soldering terminal sections 34 are connected to the first circuit patterns 33 and are electrically connected to the conductive projections 32 through the first circuit patterns 33.

The male connector block 3 configured as above is mounted on the surface of the rigid substrate 1 by soldering the soldering sections 31a of the first base substrate 31 to the rigid substrate 1. The conductive projections 32 are electrically connected to the rigid substrate 1 through the first circuit patterns 33 and the first soldering terminal sections 34.

The female connector block 4 includes a second base substrate 40 formed into a substantially flat shape by a metal such as stainless steel or the like and an insulating film 41 wrapped onto the second base substrate 40. The second base substrate 40 is not limited to the metal plate but may be a circuit board.

The second base substrate 40 includes a substrate body 401 having an elongated rectangular plate shape and reinforcing portions 402 having a substantially C-like shape. Each of the reinforcing portions 402 includes an elongated rectangular plate-like base section 402a opposed to one long edge of the substrate body 401 with a gap 403 therebetween and a pair of extension sections 402b extending from the longitudinal opposite ends of the base portion 402a toward the substrate body 401. The extension sections 402b are connected to the substrate body 401.

The substrate body 401 has a plurality of insertion holes 401a formed in alignment with the conductive projections 32 of the male connector block 3. In the present embodiment, the insertion holes 401a are alternately formed at one long edge side and at the other long edge side along the longitudinal direction of the substrate body 401. The formation positions of the insertion holes 401a in the substrate body 401 are decided by the arrangement of the conductive projections 32. For example, if the conductive projections 32 are arranged in a matrix shape as shown in FIG. 3, the insertion holes 401a corresponding to the conductive projections 32 are also formed in a matrix shape in the second base substrate 40.

The reinforcing portions 402 are respectively provided at one long edge side and at the other long edge side of the substrate body 401.

The insulating film 41 is formed into a substantially rectangular shape by an insulating material such as polyimide or the like and is wrapped onto the substrate body 401 through the gaps 403. One surface of the insulating film 41 is fixed to the substrate body 401 by an adhesive agent or the like. The insulating film 41 includes fitting insertion sections 41a formed in alignment with the insertion holes 401a of the substrate body 401 and composed of substantially cross-like slits. On the other surface of the insulating film 41, there are formed circuit patterns (hereinafter referred to as "conductive sections 42") formed into a substantially cross-like shape in conformity with the slits of the fitting insertion sections 41a and second circuit patterns 43 extending from the conductive sections 42 toward the long edges of the insulating film 41.

In this regard, the second circuit patterns 43 led out from the conductive sections 42 existing at one long edge side of the insulating film 41 are formed to extend toward one long edge side of the insulating film 41. The second circuit patterns 43 led out from the conductive sections 42 existing at the other long edge side of the insulating film 41 are formed to extend toward the other long edge side of the insulating film 41. In the following description, the surface of the female connector block 4 on which the conductive sections 42 are formed will be referred to as "connection surface". The surface opposite to the connection surface will be referred to as "mounting surface".

The sections of the second circuit patterns 43 existing in the gaps 403 will be referred to as "second soldering terminal sections 44".

Figure 5A:
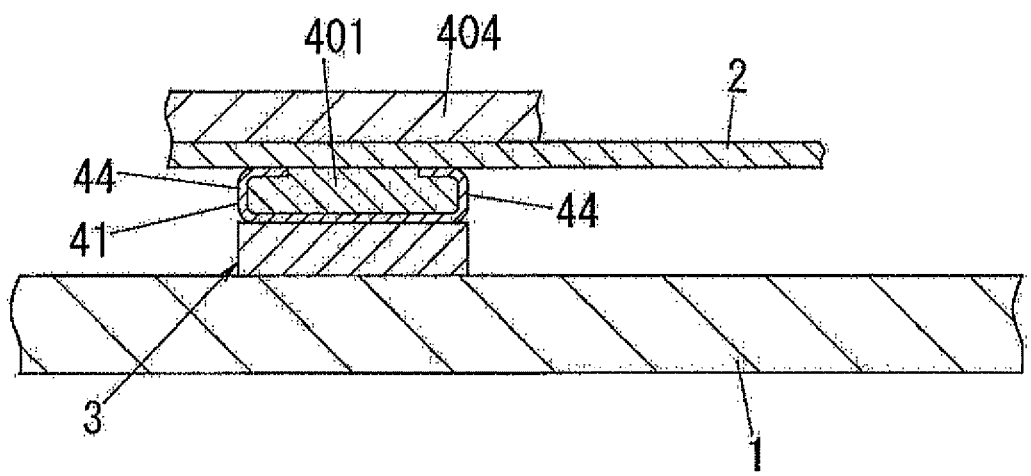
FIGS. 5A and 5B are section views of the connector.
Figure 5B:
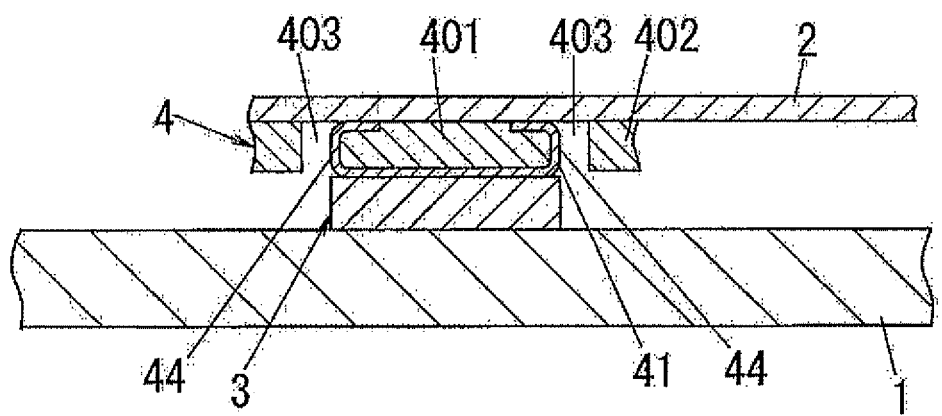

The female connector block 4 configured as above is mounted to the surface of the flexible substrate 2 by bringing the mounting surface into contact with the surface of the flexible substrate 2 and soldering the reinforcing portions 402 to the flexible substrate 2 as shown in FIGS. 5A and 5B. The conductive sections 42 are electrically connected to the flexible substrate 2 through the second circuit patterns 43 and the second soldering terminal sections 44.

In this regard, the extension sections 402b of the reinforcing portions 402 are inclined toward the mounting surface as the extension sections 402b extend from the substrate body 401 toward the base section 402a, whereby a space for wrapping the insulating film 41 onto the substrate body 401 is formed between the substrate body 401 and the flexible substrate 2. Since the wiring patterns formed on the surface of the flexible substrate 2 are covered with an insulating layer, no short circuit is generated even if the reinforcing portions 402 come into contact with the surface of the flexible substrate 2.

Figure 4:
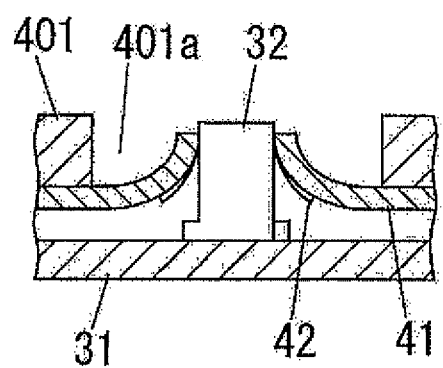
FIG. 4 is a partially enlarged section view of the connector.

When connecting the male connector block 3 and the female connector block 4 together, the conductive projections 32 of the male connector block 3 are inserted into the fitting insertion sections 41a of the insulating film 41 at the side of the connection surface of the female connector block 4. Consequently, as shown in FIG. 4, the conductive projections 32 are fitted to the fitting insertion sections 41a and are electrically connected to the conductive sections 42, whereby the male connector block 3 and the female connector block 4 are electrically and mechanically connected to each other.

In the connector of the present embodiment including the male connector block 3 and the female connector block 4, the male connector block 3 and the female connector block 4 are formed independently of the rigid substrate 1 and the flexible substrate 2. Therefore, even if a trouble is generated in the male connector block 3 or the female connector block 4, it is possible to solve the trouble by merely replacing the male connector block 3 or the female connector block 4 without having to replace the rigid substrate 1 or the flexible substrate 2.

Inasmuch as the female connector block 4 having the fitting insertion sections 41a is provided independently of the flexible substrate 2, there is no need to form fitting insertion sections in the flexible substrate 2. This makes it possible to enhance the degree of freedom of circuit design in the flexible substrate 2.

The extension sections 402b of the substantially C-like reinforcing portions 402 are connected to the longitudinal opposite ends of the substrate body 401. The base sections 402a opposed to the long edges of the substrate body 401 are soldered to the flexible substrate 2. Therefore, when inserting and removing the male connector block 3 with respect to the female connector block 4, it is possible to prevent stresses from being applied to the contact points between the second soldering terminal sections 44 and the flexible substrate 2. This makes it possible to prevent the second soldering terminal sections 44 from being broken by the stresses.

In an instance where the reinforcing portions 402 are not provided as shown in FIG. 5A, a separate reinforcing member 404 opposed to the substrate body 401 across the flexible substrate 2 needs to be provided in order to prevent the second soldering terminal sections 44 form being broken by the deformation of the female connector block when detaching the male connector block and the female connector block from each other. In this case, a problem is posed in that the thickness of the connector is increased by the thickness of the reinforcing member 404.

In the connector of the present embodiment, as shown in FIG. 5B, the reinforcing portions 402 are provided in an opposing relationship with the long edges of the substrate body 401. This increases the strength of the substrate body 401 and eliminates the need to provide the reinforcing member 404. It is therefore possible to reduce the thickness of the connector by the thickness of the reinforcing member 404.

In the present embodiment, the substrate body 401 and each of the reinforcing portions 402 are connected to each other at two points (at the longitudinal opposite ends of the substrate body 401). However, the number of connection points and the connection positions are not limited to the ones described above. The substrate body 401 and each of the reinforcing portions 402 may be connected to each other at one point or at three or more points. The substrate body 401 and each of the reinforcing portions 402 may be connected to each other in the positions other than the longitudinal opposite ends of the substrate body 401.

Figure 6:
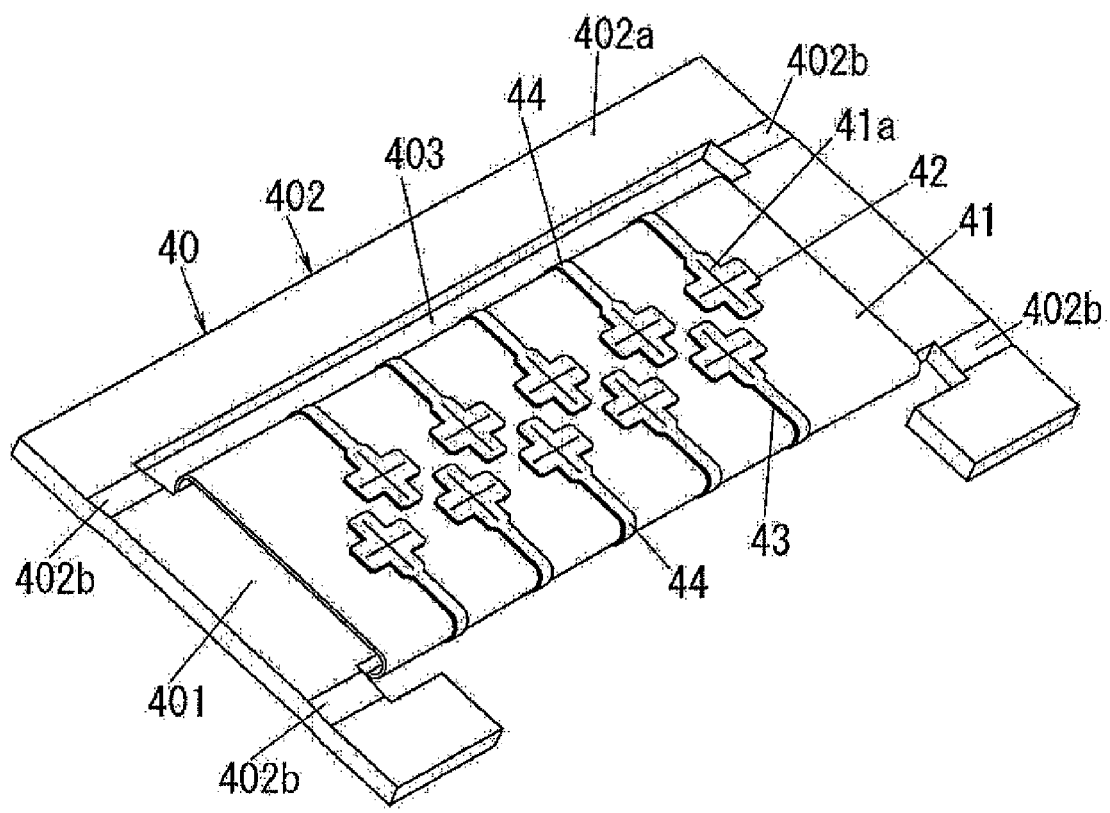
FIG. 6 is a perspective view showing one modified example of the female connector block of the connector.
Figure 7:
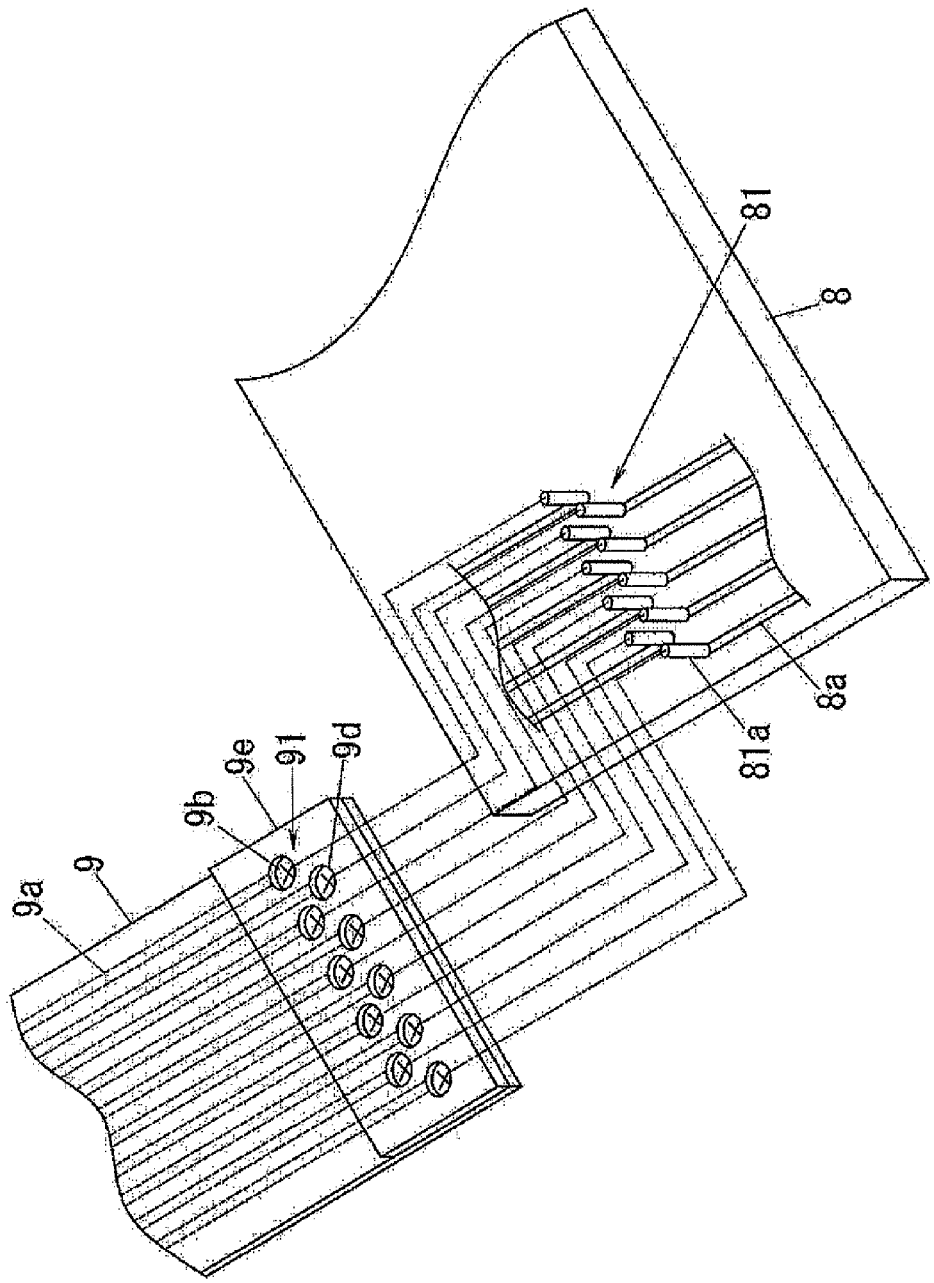
FIG. 7 is a perspective view showing a conventional connector structure.
Figure 8:
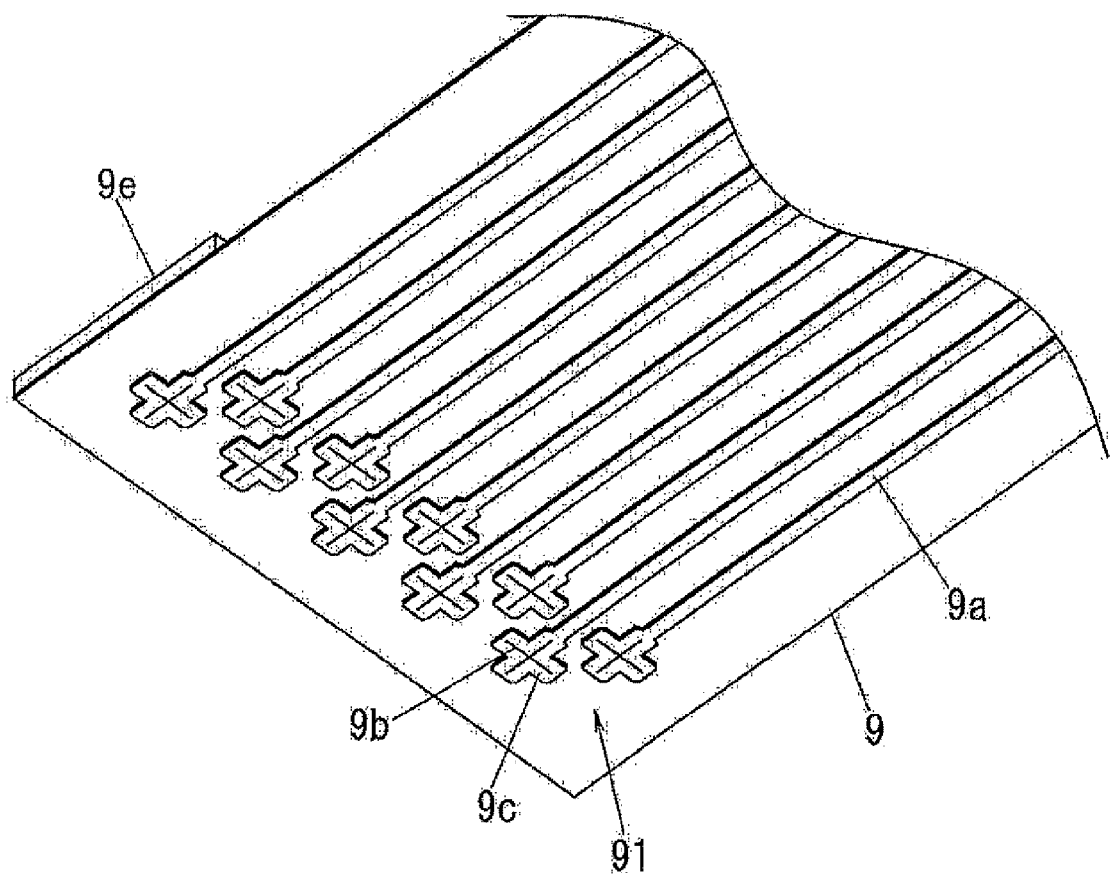
FIG. 8 is a perspective view showing a second connector block of the conventional connector structure.

In the present embodiment, a pair of reinforcing portions 402 extends from the substrate body 401. Alternatively, only one of the reinforcing portions 402 may be provided as shown in FIG. 6. In this case, obstacles such as the reinforcing portions 402 do not exist around the second soldering terminal sections 44 provided in the edge not opposed to the reinforcing portion 402. It is therefore easy to perform a soldering work. This makes it possible to enhance the soldering accuracy and the insulation between the terminal sections.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A male connector block for electrically and mechanically connecting a circuit board to a female connector block in which a conductive section electrically connected to a second circuit pattern extends along a fitting insertion section formed in the circuit board, comprising:
   a base substrate formed of an insulating flat member;
   a conductive projection arranged on one surface of the base substrate, the conductive projection being adapted to be inserted into a fitting insertion section of the female connector block and electrically connected to the conductive section;
   a first circuit pattern led out from the conductive projection; and
   a soldering terminal section formed on the base substrate and electrically connected to the conductive projection through the first circuit pattern, the male connector block being adapted to be mounted to the circuit board.

2. A female connector block for electrically and mechanically connecting a circuit board to a male connector block in which a conductive projection electrically connected to a first circuit pattern of a first base substrate protrudes from a surface of the first base substrate, comprising:
   an insulating film having a fitting insertion section into which the conductive projection of the male connector block is inserted;
   a conductive section formed on one surface of the insulating film and electrically connected to the conductive projection inserted into the fitting insertion section;
   a second circuit pattern led out from the conductive section and formed on one surface of the insulating film;
   a soldering terminal section formed on one surface of the insulating film and electrically connected to the conductive section through the second circuit pattern; and
   a second base substrate making close contact with the other surface of the insulating film wrapped onto the second base substrate, the second base substrate having an insertion hole formed in alignment with the fitting insertion section, the female connector block being adapted to be mounted to the circuit board.

3. A connector assembly, for electrically and mechanically interconnecting two circuit boards whose surfaces are at least partially opposed to each other, comprising:
   a male connector block comprising:
      a base substrate formed of an insulating flat member; a conductive projection arranged on one surface of the base substrate, the conductive projection being adapted to be inserted into a fitting insertion section of a female connector block;
      a first circuit pattern led out from the conductive projection; and
      a soldering terminal section formed on the base substrate and electrically connected to the conductive projection through the first circuit pattern, the male connector block being adapted to be mounted to the circuit board; and
   the female connector block of claim 2,
      wherein the conductive projection of the male connector block is inserted into the fitting insertion section of the female connector block and electrically connected to the conductive section.

4. The female connector block of claim 2, wherein the second base substrate includes a substrate body onto which the insulating film is wrapped and a reinforcing portion extending from the substrate body, the reinforcing portion being opposed to at least one of mutually-opposing lateral edges of the substrate body with a gap therebetween, the reinforcing portion being soldered to the circuit board, the insulating film being wrapped onto the substrate body through the gap.

5. A connector assembly for electrically and mechanically interconnecting two circuit boards whose surfaces are at least partially opposed to each other, comprising:
   a male connector block comprising:
      a base substrate formed of an insulating flat member; a conductive projection arranged on one surface of the base substrate, the conductive projection being adapted to be inserted into a fitting insertion section of a female connector block;
      a first circuit pattern led out from the conductive projection; and
      a soldering terminal section formed on the base substrate and electrically connected to the conductive projection through the first circuit pattern, the male connector block being adapted to be mounted to the circuit board; and
   the female connector block of claim 4,
      wherein the conductive projection of the male connector block is inserted into the fitting insertion section of the female connector block and electrically connected to the conductive section.

* * * * *